United States Patent [19]

Mazor et al.

[11] Patent Number: 5,438,413
[45] Date of Patent: Aug. 1, 1995

[54] PROCESS FOR MEASURING OVERLAY MISREGISTRATION DURING SEMICONDUCTOR WAFER FABRICATION

[75] Inventors: Isaac Mazor, Haifa; Noam Knoll, Zicron Jackob; Yoram Uziel, Kibutz Yodfat, all of Israel

[73] Assignee: KLA Instruments Corporation, San Jose, Calif.

[21] Appl. No.: 25,435

[22] Filed: Mar. 3, 1993

[51] Int. Cl.$^6$ .................................................. G01B 9/02
[52] U.S. Cl. ...................................... 356/363; 356/358; 356/400; 356/401
[58] Field of Search .............. 356/363, 358, 359, 360, 356/400, 401; 250/572

[56] References Cited

U.S. PATENT DOCUMENTS

| | | | |
|---|---|---|---|
| 4,355,899 | 10/1982 | Nussmeier | 356/358 |
| 4,818,110 | 4/1989 | Davidson | 356/359 |
| 5,017,011 | 5/1991 | Lisson et al. | 356/363 |
| 5,112,129 | 5/1992 | Davidson et al. | 356/359 |
| 5,258,821 | 11/1993 | Doggett et al. | 356/358 |

FOREIGN PATENT DOCUMENTS

| | | | |
|---|---|---|---|
| 63-128205 | 5/1988 | Japan | 356/363 |
| 2170005 | 7/1986 | United Kingdom | 356/358 |

*Primary Examiner*—Rolf Hille
*Assistant Examiner*—Minhloan Tran
*Attorney, Agent, or Firm*—Claude A. S. Hamrick

[57] ABSTRACT

A process for measuring overlay misregistration during semiconductor wafer fabrication including the use of an interferometric microscope in combination with a camera, a wafer transport stage, and data processing electronics to form an inspection system which can utilize either broadband or narrowband light, and large or small numerical aperture (NA) to develop a series of interference images taken at different Z (vertical) planes relative to the surface under investigation or P (pathlength) positions relative to interferometer arm difference. The data in these planes is then used to calculate the magnitude and phase of the mutual coherence between the object wave and the reference wave for each pixel in the image planes, and synthetic images are formed, the brightness of which is proportional to either the complex magnitude (the Magnitude Contrast Image or MCI) or the phase of the mutual coherence as the optical pathlength (the Phase Contrast Image or PCI) is varied. The difference between synthetic images relating to target attribute position and bullet attribute position are then used as a means of detecting misregistration between the processing layer including the bullet attribute and the processing layer including the target attribute.

12 Claims, 9 Drawing Sheets

PROCESS FOR MEASURING OVERLAY MISREGISTRATION DURING SEMICONDUCTOR WAFER FABRICATION

BACKGROUND OF THE INVENTION

FIELD OF THE INVENTION

The present invention relates generally to precision optical inspection methods and apparatus, and more particularly to a method and apparatus for performing microscopic measurement of alignment between at least two process layers on integrated circuit wafers using a coherence probe microscope in combination with electronic image processing.

BRIEF DESCRIPTION OF THE PRIOR ART

As integrated circuit processing becomes more and more precise and the dimensions of the various circuit components become smaller, the necessity for precision alignment of each process layer to preceding process layers becomes greater. In order to facilitate alignment of the various process layers, small alignment images are typically included in the photomasks used to photolithigraphically produce each layer, with each such image being intended to produce on the wafer substrate an alignment attribute to which a corresponding attribute of a subsequent layer can be aligned.

A simplified example of what is often referred to as a box-in-box misregisration target is depicted generally in FIG. 1 of the drawing. As illustrated, a first photolithographic processing mask 10 is provided with a box-shaped "target" image 12 typically positioned in one or more locations surrounding the semiconductor artwork 14. During photolithographic processing of wafer 16, a target attribute 18 is developed on the wafer surface at the same time that the semiconductor features 20 are developed. The layer locating attribute and circuit features are then typically covered over by a resist, oxide, sputtered layer, etc. A subsequent mask 22 includes a smaller box-shaped "bullet" image 24, the design position of which is intended to have center-to-center alignment with the target 12. In addition, the mask 22 will typically have another target image 26 provided to facilitate subsequent alignment steps.

During the use of mask 22, it will be aligned so as to as closely as possible position the bullet attribute 28 created by image 24 exactly within the center of target attribute 18. Subsequent masks 30 will have similar target images 32 and bullet images 34 provided therein. In addition to the box-in-box variety, typical overlay misregistration targets include bar-in-bar, L-shaped, single or double layer targets or may be formed from the actual active device. The overlay misregistration error is measured by finding the differences in X and Y between the centers of the test, or bullet attributes and the reference, or target attributes. The result is a vector representation of the misregistration error.

One prior art technique for integrated circuit metrology, often used for overlay misregistration measurements, includes the use of an ordinary microscope with some form of electronic detector (video camera, linear array, etc.) positioned at the image plane. However, the capability of a bright field microscope is limited in that it can only measure the intensity of the optical wave amplitude and cannot measure a full complex amplitude which includes both magnitude and phase. As a consequence, it is difficult to measure some overlay misregistration targets in which a three-dimensional topography measurement is needed.

The coherence probe microscope (CPM) is a form of optical microscope which uses optical images obtained from an interference microscope together with electronic processing in order to produce a synthetic image whose pixel gray scales are proportional to the magnitude of the mutual coherence function or the degree of coherence between light instant on and reflected off corresponding pixels of the object and reference images. Coherence probe microscopes and their uses are disclosed in U.S. Pat. No. 4,818,110 issued to Mark Davidson for "Method and Apparatus of Using a Two-Beam Interference Microscope for Inspection of Integrated Circuits and the Like", and in U.S. Pat. No. 5,112,129 issued to Davidson et. al. entitled "Method of Image Enhancement for the Coherence Probe Microscope with Applications to Integrated Circuit Metrology".

CPM technology has heretofore been used to measure line widths and other features of integrated circuits. However, it has not been used at each step during the photolithographic fabrication process to determine mask misregistration.

One of the problems associated with use of any optical device in determining bullet-in-target registration is that typically the target attribute per se is often not visible directly, as it is frequently covered by a sputtered coating or an oxide or resist coating, and the inspection process must rely upon an interpretation of the overlying surface variation as an indicator of the boundaries of the covered attribute.

Sputtering is a coating process in semiconductor fabrication which is accomplished by the acceleration of a very high density liquid at a wafer. The result of the coating process is that one edge may be asymmetrically covered relative to another. The "real" edge is covered with the sputtered material and thus shows very low contrast, while on the other hand the high contrast comes from the new edge formed by the covering material. This often results in an overlay misregistration measurement error due to triggering on the wrong edges when performing a bright field measurement.

For example, in FIG. 2 of the drawing, a wafer 40 is depicted in cross-section having a target attribute 42 formed as an opening in a process layer 44. The layer 44 has in turn been sputter-coated with a layer of material 46. Although its surface tends to follow the change in height of the surface over which it is applied, the fact that the material is typically accelerated at other than a direction normal to the surface of the wafer tends to cause a buildup on one or more sides of an opening, much like a snowdrift tends to build up more on the facing surface of a wall, fence, building or other obstacle. Consequently, if one relies upon the most optically definitive lowest surface 48 as a means of registrating a subsequent mask, and the bullet attribute 50 is centered therein, a subsequent analysis will often indicate that substantial misregistration has occurred, as evidenced by the different distances corresponding to the arrows 52 and 54.

Low contrast layers, such as depicted in FIG. 3, are often a result of a thin target attribute 60 buried under a thick transparent layer, such as a resist or oxide 62, or a coating creating a very thin step 64. The result is limited measurement performance for accuracy and repeatability when using standard bright field microscopy. Similar measurement difficulty can be encountered in situations, such as depicted in FIG. 4, wherein real edge magnitude contrast is very high but thickness is as small as a fraction of a wavelength.

SUMMARY OF THE PRESENT INVENTION

It is therefore a principal objective of the present invention to provide an improved method and apparatus for measuring overlay misregistration during semiconductor processing.

Another objective of the present invention is to provide an improved method of the type described wherein three-dimensional imaging of misregistration targets is accomplished using coherence probe microscope technology.

Briefly, a presently preferred embodiment of the present invention involves the use of an interferometric microscope in combination with a camera, a wafer transport stage, and data processing electronics to form an inspection system which can utilize either broadband or narrowband light, and large or small numerical aperture (NA) to develop a series of interference images taken at different Z (vertical) planes relative to the surface under investigation or P (pathlength) positions relative to interferometer arm difference. The data in these planes is then used to calculate the magnitude and phase of the mutual coherence between the object wave and the reference wave for each pixel in the image planes, and synthetic images are formed, the brightness of which is proportional to either the complex magnitude (the Magnitude Contrast Image or MCI) or the phase of the mutual coherence as the optical pathlength (the Phase Contrast Image or PCI) is varied. The difference between synthetic images relating to target attribute position and bullet attribute position are then used as a means of detecting misregistration between the processing layer including the bullet attribute and the processing layer including the target attribute.

Among the numerous advantages of the present invention is that it provides a much more accurate measurement of misregistration in general, and in particular, provides a more accurate measurement on certain problematical overlay objects such as sputtered layers and/or very low contrast layers.

Another advantage of the present invention is that if an inspected photoresist layer is found to be misaligned in excess of an acceptable tolerance, the layer can be removed and refabricated.

These and other objects and advantages of the present invention will no doubt become apparent to those skilled in the art after having read the following detailed description of the preferred embodiment which is illustrated in the several figures of the drawing.

IN THE DRAWING

DETAILED DESCRIPTION OF THE PREFERRED EMBODIMENT

Figure 1:
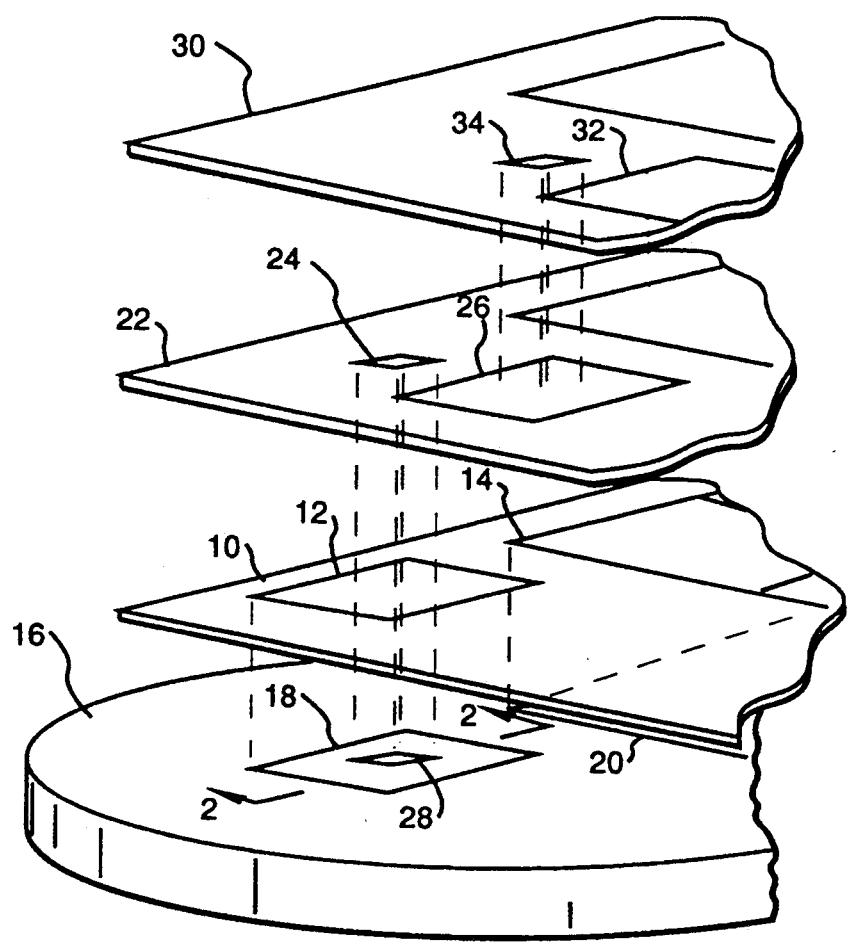
FIG. 1 is a schematic illustration depicting use of box-in-box alignment procedures during integrated circuit processing.
Figure 2:
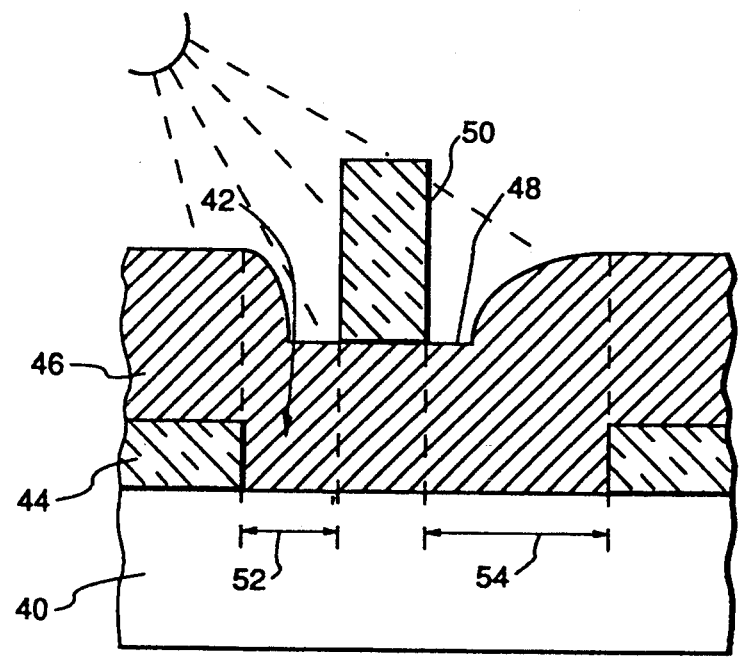
FIG. 2 is a cross-section taken through a misaligned box-in-box technique.
Figure 3:
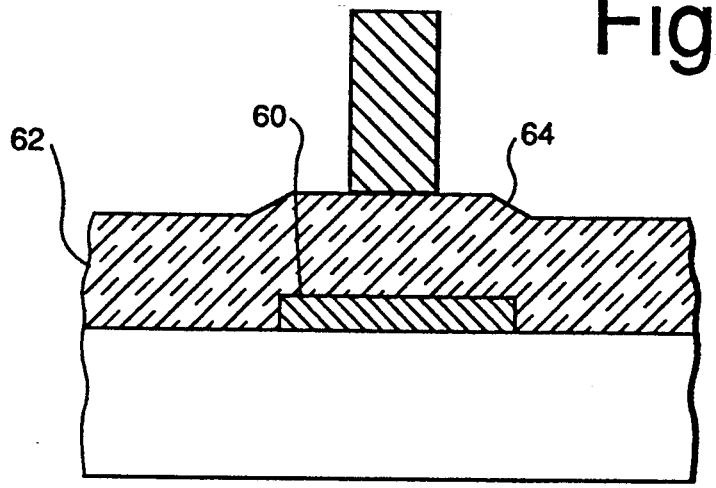
FIG. 3 is a cross-section illustrating an overlaid thin layer problem.
Figure 4:
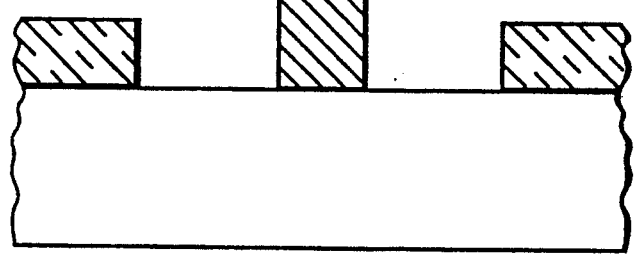
FIG. 4 is a cross-section illustrating a thin layer, sharp edge problem.
Figure 5:
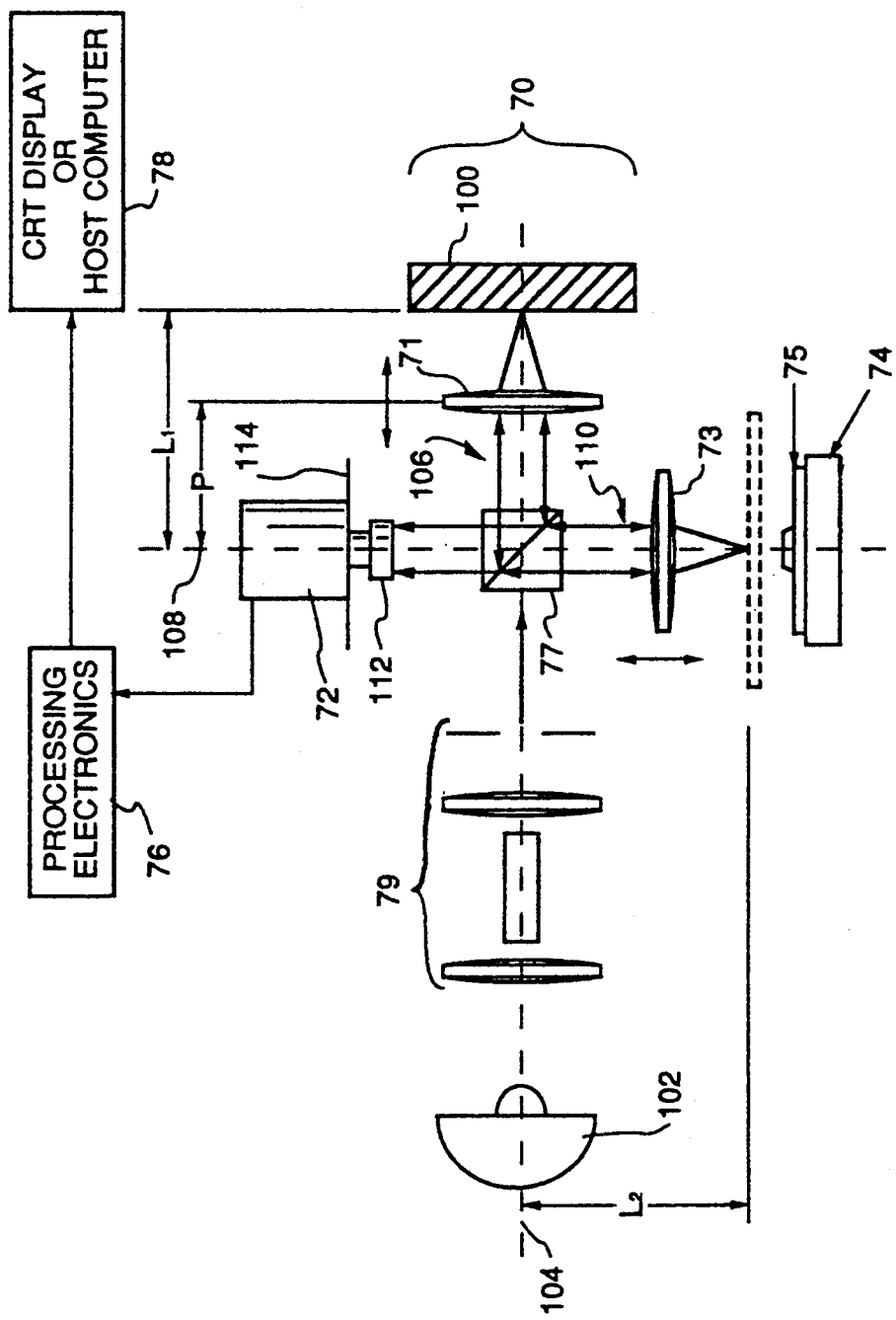
FIG. 5 is a schematic representation of a coherence probe microscope and system of the type utilized in accordance with the present invention.
Figure 6:
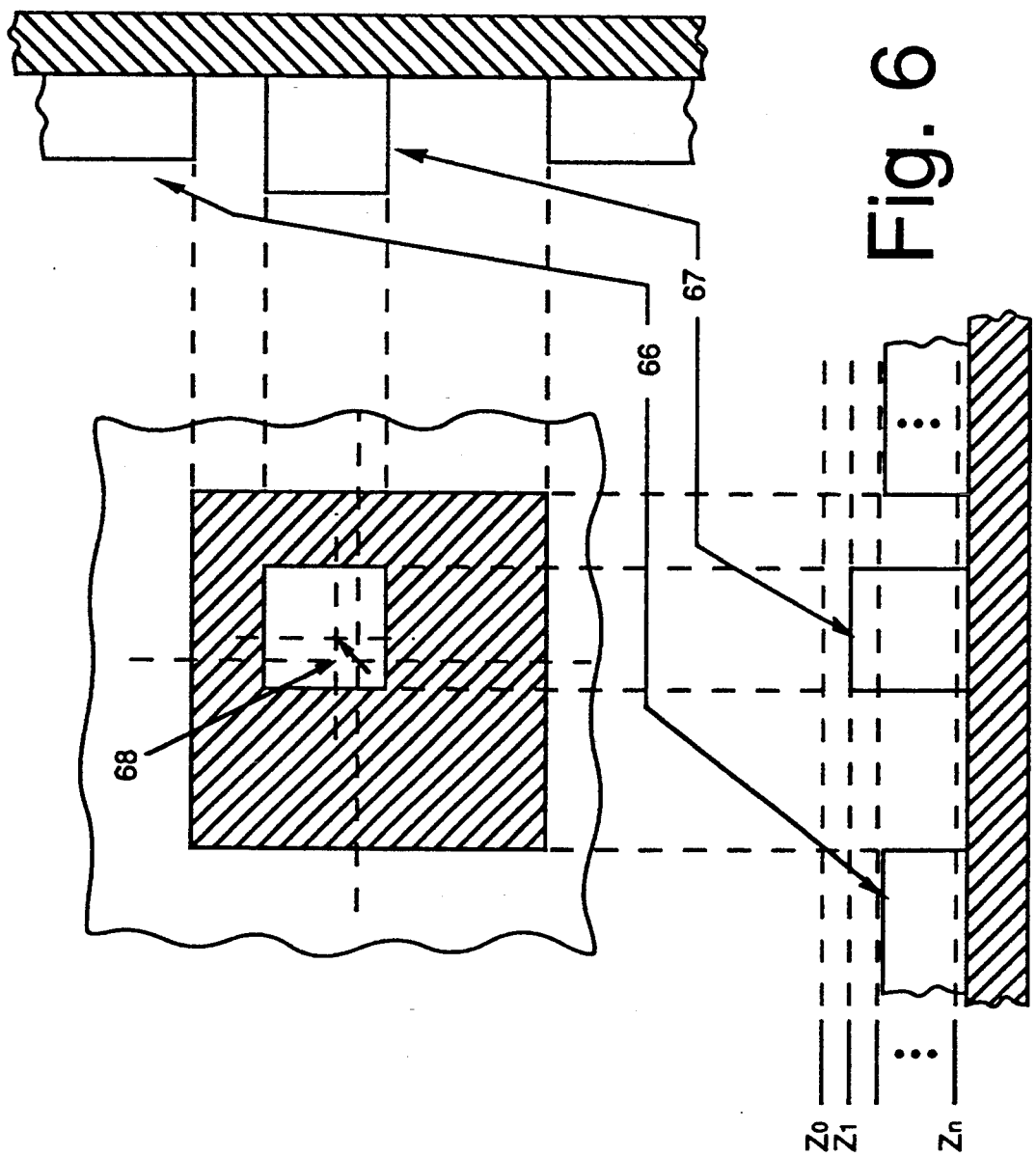
FIG. 6 is a plan and profile diagram illustrating an example of misregistration.
Figure 7:
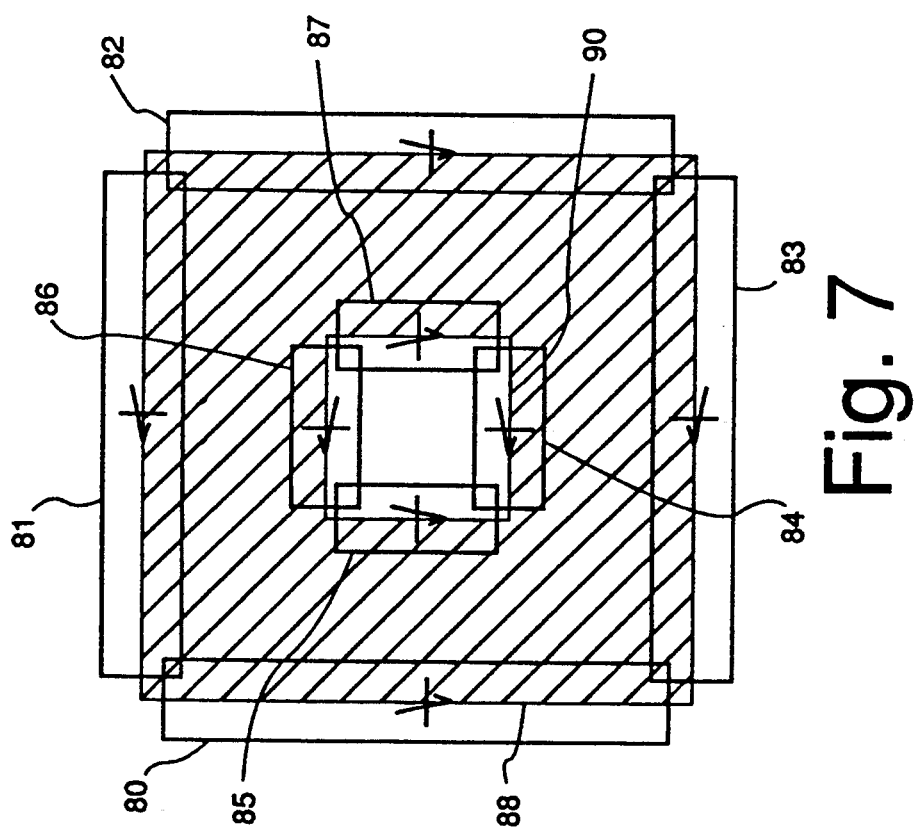
FIG. 7 is a plan view illustrating an example of the measurement zones of the misregistration target attribute and bullet attribute; and their intensity signals.
Figure 8:
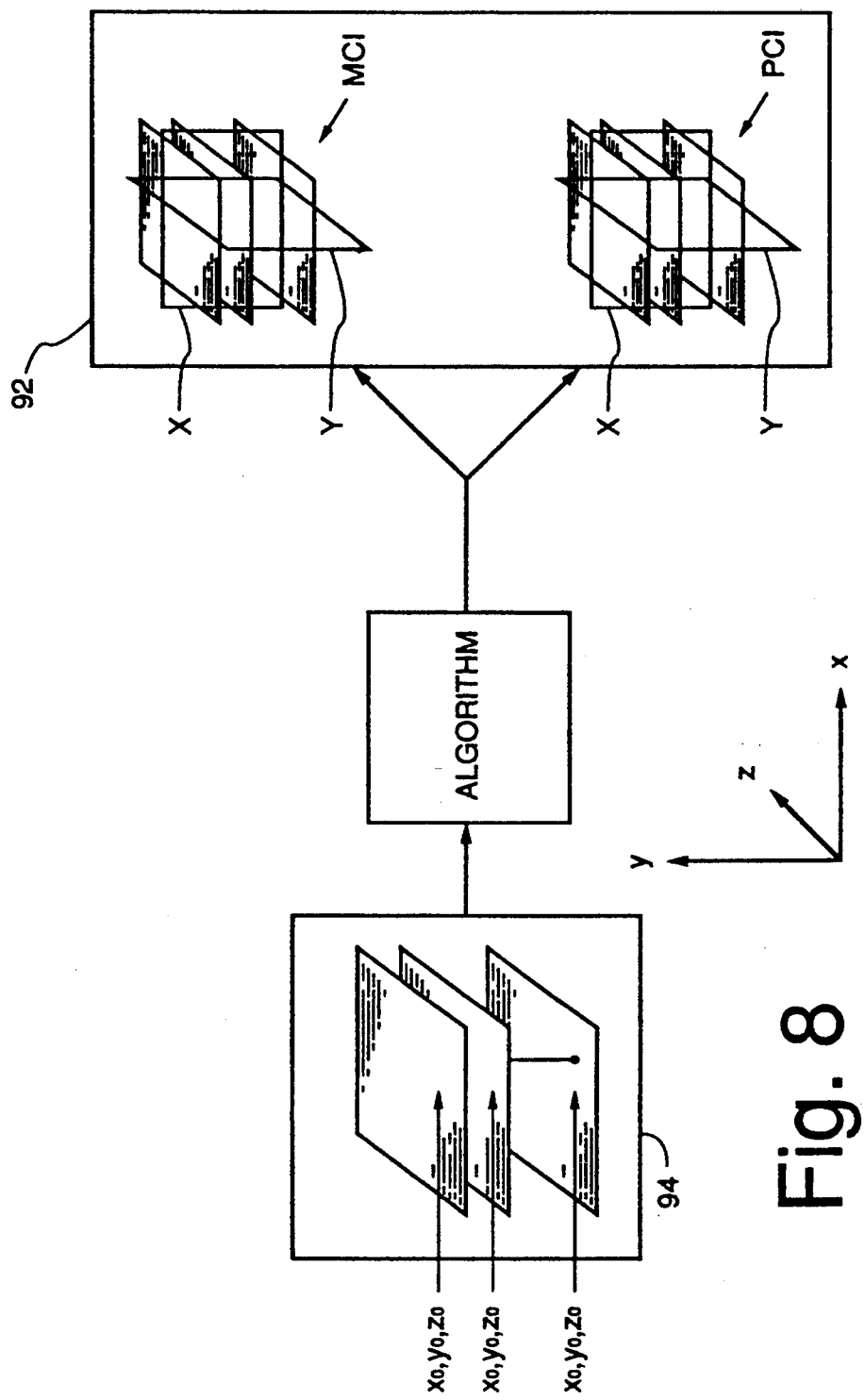
FIG. 8 is a diagram illustrating the relationship between Z scan and synthetic magnitude and phase cross-sections.

Referring now to FIG. 5 of the drawing, a system in accordance with the present invention is depicted wherein a coherence probe microscope such as the LINNIK microscope 70 having matched objectives 71 and 73 is used in combination with a camera 72, wafer transport stage 74, data processing electronics 76, and CRT display or host computer 78 to form an inspection apparatus for inspecting a wafer 75. The illustrated apparatus further includes a beam splitter 77 and a lens system and associated field stop as depicted at 79. The apparatus can utilize either broadband or narrowband light and large or small numerical aperture (NA) to develop a series of interference images forming on an image plane 114 in the camera and taken at different Z levels relative to the surface under investigation, or different P (pathlength) scan positions relative to interferometer arm differences. This is to say that the distance $L_2$ may be varied to perform a Z scan, or the distance $L_1$ can be varied to perform a P scan. To change the distance $L_1$, the reference mirror 100 is moved toward or away from the light source 102 along the optical axis 104 of the reference channel 106. To change the distance $L_2$, the XY stage 74 is moved toward or away from the camera 72 and camera lens 112 along the optical axis 108 of the object channel 100. Such scan levels are indicated by way of example in FIG. 6 of the drawing at the levels $a_0$–$z_7$ relative to the outer layer 66 and inner layer 67. A vector representing misregistration error is illustrated at 68. At each Z level, the magnitude and phase of the mutual coherence between the object wave and the reference wave for each pixel is detected in search areas 80 through 87 as illustrated in FIG. 7. Each search area is chosen to include the position of a target attribute edge 88 or bullet attribute edge 90 to be detected. As further illustrated in FIG. 8, synthetic images in multiple Z planes as depicted at 92 are then formed whose brightness is proportional to either the complex magnitude "MCI" (the Magnitude Contrast Image) or the phase of the mutual coherence, "PCI" (the Phase Contrast Image) as the optical pathlength is varied. Note that as depicted in FIG. 8 the MCI and PCI synthetic images are in effect cross-sections taken in X and Y directions through the multiple Z plane data illustrated at 94.

Figure 9:
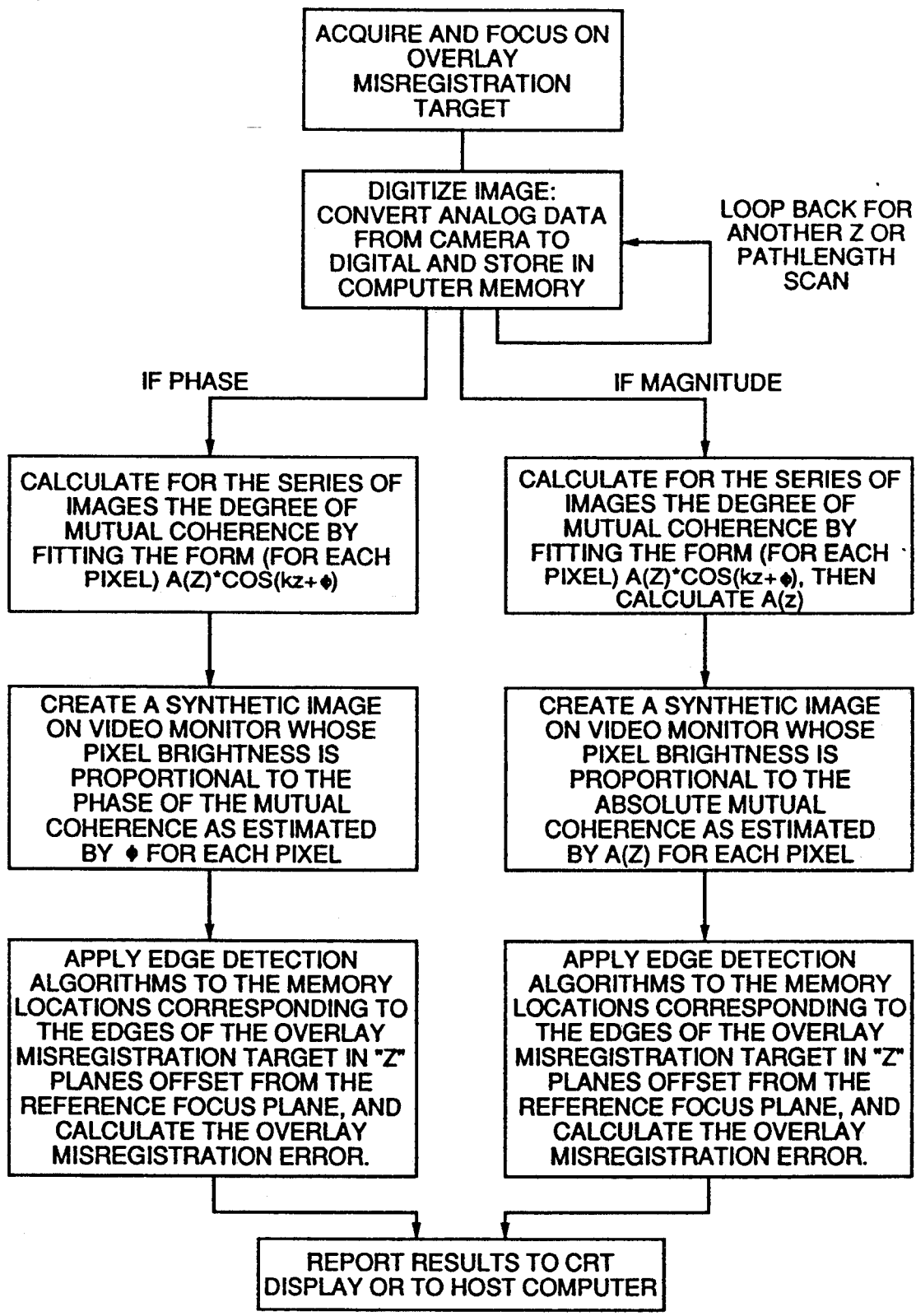
FIG. 9 is a flow chart depicting the process of the present invention.

The CPM based overlay misregistration measurement procedure includes generally the following steps as outlined in the flow chart of FIG. 9:

(1) Acquire an overlay target and focus.
(2) Using the CPM, perform a Z scan while grabbing image data for each Z plane.

(3) Apply magnitude and/or phase algorithms to raw Z plane data to obtain three-dimensional synthetic images, referred to as synthetic Z planes, each pixel of which has a gray level proportional to either the magnitude or phase of the mutual coherence data. As previously indicated, the multiple images are obtained using the CPM at either different Z positions or different optical pathlengths or both. Assume different Z positions for the calculations below. The digitized images contain data equivalent to $$I(x,y,z) = <|Er(x,y,z) + Eo(x,y,z)|^2> \quad (1)$$

when r and o are reference and objective respectively, E is the electric field, and $<>$ denotes time average or ensemble average. For simplicity of terms, the (x,y) in the expressions are omitted in the following. Expanding equation 1, one obtains $$I(z) = <|Er(z)|^2 + |Eo(z)|^2 + 2*(Re(Er(z)*Eo*(z))> \quad (2)$$

Figure 10:
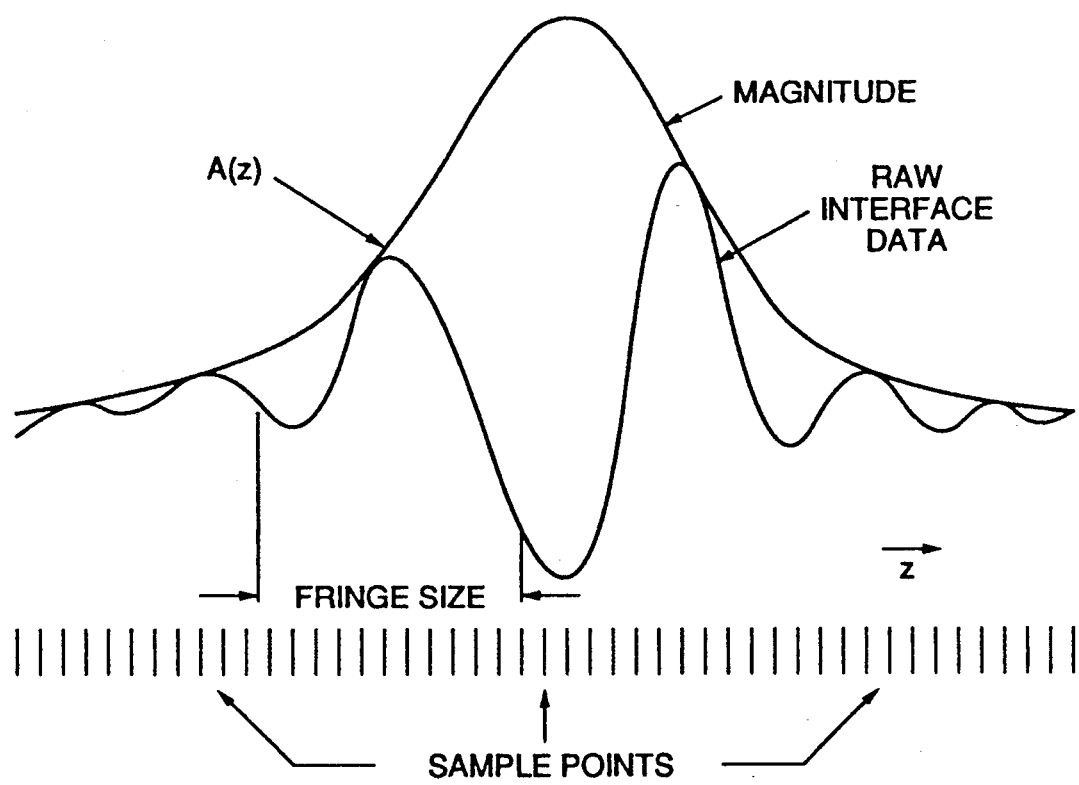
FIG. 10 depicts a practical model used in accordance with the present invention.

A practical model for equation 2 is depicted in FIG. 10 wherein for each (x,y) one can write $$I(z) = Constant + A(z)Cos(k^*z + \phi) \quad (3)$$

where $k = 2\pi/\lambda$.

Figure 11:
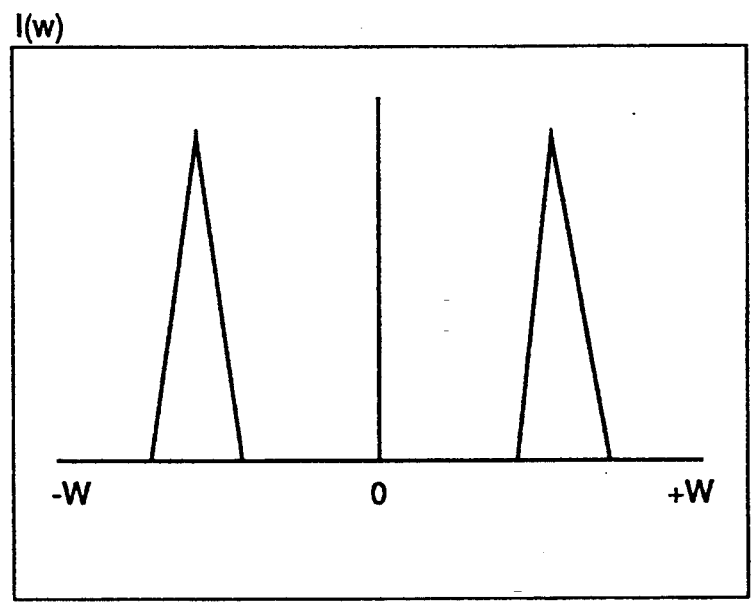
FIG. 11 illustrates the result of applying the Fourier Transform to the model of FIG. 10.

Applying the Fourier Transform to the model:

$$I(\omega) = \frac{1}{\sqrt{2\pi i}} \int A(z) \frac{1}{2i} (e^{ikz} + e^{-ikz}) e^{-i\omega z} dz \quad (4)$$

$$= \frac{1}{\sqrt{2\pi i}} \frac{1}{2i} [\int A(z) e^{-i(\omega-k)z} e^{i\phi} dz + \int A(z) e^{-i(\omega+k)z} e^{-i\phi} dz]$$

$$= \frac{e^{i\phi}}{2i} A(\omega - k) + \frac{e^{-i\phi}}{2i} A(\omega + k).$$

the result is as depicted in FIG. 11.

Figure 12A:
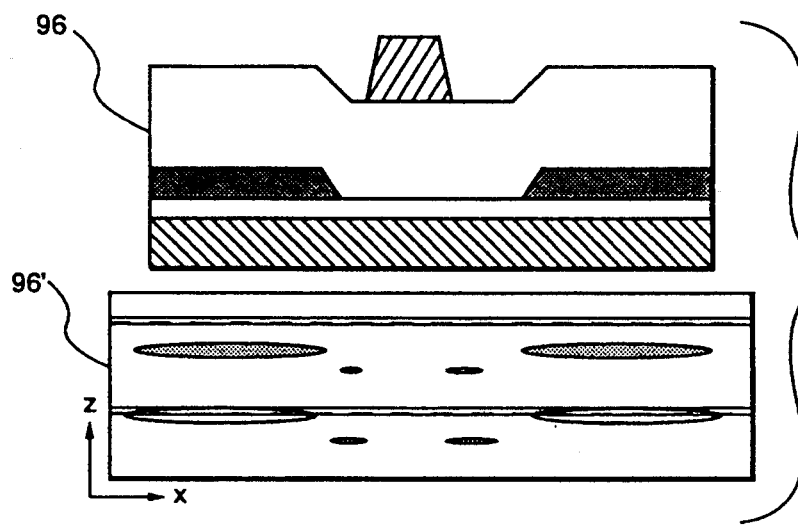
FIG. 12a and 12b illustrate examples of CPM intensity cross-section plots.
Figure 12B:
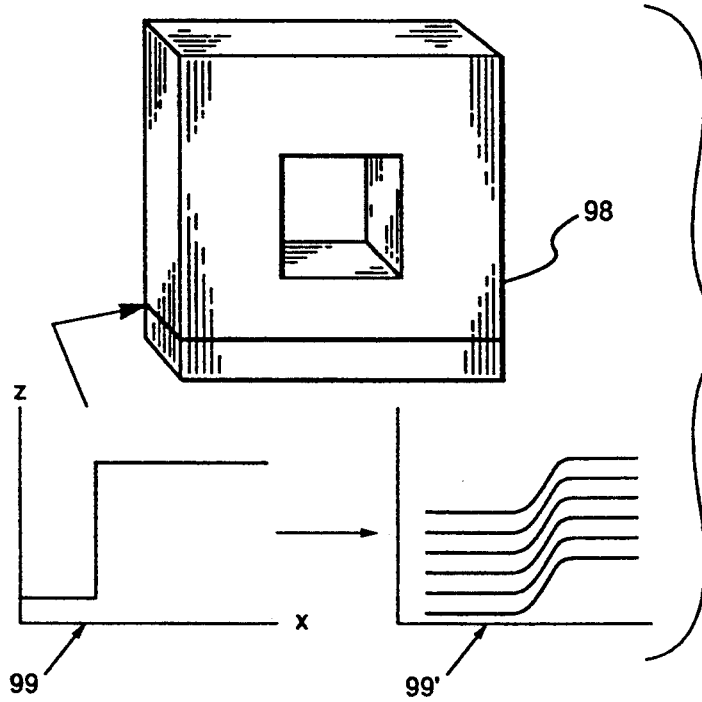

Ignoring the negative frequencies and performing the inverse Fourier Transform, $$\frac{A(z)}{2i} [\cos(kz + \phi) + i \sin(kz + \phi)] = \quad (5)$$

$$A(z) \left( -\frac{1}{2} (\sin(kz + \phi) + i \cos(kz + \phi)) \right) = S(z)$$

$$A(z) = [[Re(S(z))]^2 + [Im(S(z))]^2]*4 \quad (6)$$

$$Tan(k^*z + \phi) = Im(S(z))/Re(S(z))$$

where A (z) is the magnitude contrast and k*z is the phase contrast. The phase or the amplitude data is then displayed on the CRT or another electronic display with the gray scale derived from A(z) or k*z as depicted in FIGS. 12a and 12b wherein Grayscale(z)=MAX(A(z)) (magnitude contrast intensity) and Grayscale(z)=k*z (phase contrast intensity)

(4) For each of the attributes, select the best focus layer (usually by maximum contrast of attribute edges or other choices determined by the actual target topography). Out of the synthetic Z planes apply edge detection algorithms to find the edges of the target and bullet attributes. If the same plane is used to calculate the test (bullet) and reference (target) edges, it will be considered as a single grab mode; otherwise it will be a double grab mode.

(5) Compute the overlay misregistration error by finding the difference between the centers of the test and reference layers.

(6) Report the results to a CRT display or to a host computer.

For the above-illustrated special cases, measurement error using prior art techniques is in general large. However, in using the CPM in accordance with the present invention, even though the pixel size varies according to the magnification, the precision of the overlay misregistration measurement is significantly less than the pixel size. FIG. 12a depicts at 96 a cross-section taken through a wafer. A corresponding CPM amplitude cross-section is illustrated at 96'.

For the edge detection conducted in step (4) above, any of the well-known edge detection schemes in image processing may be used. However, the preferred method is to store phase contrast and/or magnitude contrast sample image data taken from the eight areas, 80 through 87, for each surface level of a reference wafer. Then for the wafer under test (cross) correlate the data for each area of a reference image with data from a corresponding area of the wafer under test. The optimum edge position is then the weighted average of the locations where the two correlations reach their maximum. The weights are determined empirically, depending on the contrasts of the phase and magnitude functions. In FIG. 12b CPM phase intensity is illustrated at 98 with a target cross-section being illustrated at 99 and phase contrast cross-sections illustrated at 99'.

Although the preferred embodiment of the present invention has been described in terms of a single embodiment, it is anticipated that various alterations and modifications thereof will become apparent to those skilled in the art after having read this disclosure. It is therefore intended that the following claims be interpreted as covering all such alterations and modifications as fall within the true spirit and scope of the invention.

What is claimed is:

1. A method of inspecting a semiconductive wafer in process to determine the accuracy of alignment of one process layer to a subsequent process layer formed thereover, said subsequent layer having at least a second alignment attribute intended to have a predetermined registrational relationship to a corresponding first alignment attribute of said one layer, said first and second attributes each being defined by at least one edge of geometric bodies formed during fabrication of said one and said subsequent process layers, comprising the steps of:

using an interference optical system including an object channel and a reference channel for simultaneously inspecting said wafer and a reflective reference surface, and developing a plurality of images formed by the interference between object wave energy, passing from said wafer and through said object channel to an image plane, and reference wave energy passing from said reference surface and through said reference channel to said image plane, each said image being formed in response to a change in axial position of either said wafer along the optical axis of said object channel or said reference surface along the optical axis of said reference channel;

detecting for each image the magnitude of the mutual coherence between the object wave energy reflected from a portion of the surface of said wafer including said second attribute, and from a portion of said wafer including at least a vestige of said first attribute, and said reference wave energy;

using the magnitude coherence data to generate synthetic image data representative of at least one edge of said first attribute and at least one edge of said second attribute; and using said synthetic image data to determine the relative alignment of said second attribute of said subsequent layer to said first attribute of said one layer.

2. A method of inspecting a semiconductive wafer in process for determining the accuracy of alignment of a first process layer to a second process layer subsequently formed thereover, said second layer having at least one alignment attribute intended to have a predetermined registrational relationship to a corresponding alignment attribute of said first layer, said first and second attributes each being defined by at least one edge of geometric bodies formed during fabrication of said first and second process layers, comprising the steps of:

using an interference optical system including an object channel and a reference channel for simultaneously inspecting said wafer and a reflective reference surface, and developing a plurality of images formed by the interference between object wave energy, passing from said wafer and through said object channel to an image plane, and reference wave energy passing from said reference surface and through said reference channel to said image plane, each said image being formed in response to a change in axial position of either said wafer along the optical axis of said object channel or said reference surface along the optical axis of said reference channel;

detecting for each image the phase value of the mutual coherence between the object wave energy reflected from a portion of the surface of said wafer including said second attribute, and from a portion of said wafer including at least a vestige of said first attribute, and said reference wave energy;

using the phase value coherence data to generate synthetic image data representative of at least one edge of said first attribute and at least one edge of said second attribute; and using said synthetic image data to determine the relative alignment of said second attributes of said second layer to said first attribute of said first layer.

3. A method of inspecting and determining overlay misregistration during the fabrication of semiconductor devices comprising the steps of:

using an interference optical system including an object channel and a reference channel for simultaneously inspecting the surface of a semiconductive wafer including a bullet attribute and an overlaid target attribute, and a reflective reference surface, developing images formed by the interference between object wave energy passing from the inspected wafer surface through the object channel to an image plane and reference wave energy passing from a reference surface through the reference channel to the image plane, each image being formed in response to a change in position of either the inspected surface or the reference surface;

detecting for each scan image the magnitude of the mutual coherence between the object wave energy and the reference wave energy; and using the magnitude of the mutual coherence data to generate synthetic image data representative of a particular characteristic of misregistration of said bullet attribute to said target attribute wherein the brightness of each pixel element of a synthetic image developed using synthetic image data is proportional to the magnitude of the mutual coherence data.

4. A method according to claim 3, wherein said interference optical system uses broad band light.

5. A method according to claim 3, wherein said interference optical system uses narrow band light.

6. A method of inspecting and determining overlay misregistration during the fabrication of semiconductor devices comprising the steps of:

using an interference optical system including an object channel and a reference channel for simultaneously inspecting the surface of a semiconductive wafer including a bullet attribute and an overlaid target attribute, and a reflective reference surface, developing images formed by the interference channel between object wave energy passing from the inspected wafer surface through the object channel to an image plane, and reference wave energy passing from a reference surface through the reference channel to the image plane, each image being formed in response to a change in position of either the inspected surface or the reference surface;

detecting for each image the phase value of the mutual coherence between the object wave energy and the reference wave energy; and using the phase value of the mutual coherence data to generate synthetic image data representative of a particular characteristic of misregistration of said bullet attribute and said target attribute, wherein the brightness of each pixel element of a synthetic image developed using synthetic image data is proportional to the phase value of the mutual coherence data.

7. A method according to claim 6, wherein said interference optical system uses broad band light.

8. A method according to claim 6, wherein said interference optical system uses narrow band light.

9. A process for generating image data representative of an at least partially reflective irregular surface of an overlay target formed by a portion of a semiconductor wafer having layers which contain corresponding alignment attributes comprising the steps of:

(a) illuminating the wafer surface containing the attributes with light from a source;

(b) illuminating a reflective surface including an optically flat mirror with light from said source;

(c) collecting the light reflected from the wafer surface and directing the collected wafer light along a first optical axis;

(d) collecting the reference light reflected from the reference surface and directing the collected reference light along a second optical axis;

(e) focusing the collected light directed along said first and second optical axes to form a fringed image pattern resulting from interference of wafer light and reference light;

(f) scanning the fringed image patterns along all edges formed by the attribute and in a direction perpendicular to those edges;

(g) incrementally changing the position of the wafer along the first optical axis, each time repeating steps (a) through (f);

(h) inspecting the image patterns developed at each position along the first optical axis to develop a series of mutual coherence magnitude data along each of the scanned edges;

(i) processing the coherence magnitude data to develop synthetic image data corresponding to a cross-section profile of the edges of the attributes taken in a plane including selected scanned edges;

(j) determining the attribute edges or center by applying edge detection algorithms or center of mass algorithms to the synthetic image data; and (k) using the attribute edges or center to compute an alignment value that represents the amount of misregistration between the layers of the semiconductor wafer.

10. A process as recited in claim 9 wherein the step of using the attribute edges or center includes the steps of:

computing the center of a first attribute from a first layer as defined by the edges thereof;

computing the center of a corresponding second attribute from a second layer as defined by the edges thereof;

computing the difference between the center of the first attribute and the center of the second attribute, which represents an amount of misregistration between the first layer and the second layer; and reporting the amount of misregistration to a suitable display means.

11. A process for generating image data representative of an at least partially reflective irregular surface of an overlay target formed by a portion of a semiconductor wafer having layers which contain corresponding alignment attributes comprising the steps of:

(a) illuminating the wafer surface containing the attributes with light from a source;

(b) illuminating a reflective surface including an optically flat mirror with light from said source;

(c) collecting the light reflected from the wafer surface and directing the collected wafer light along a first optical axis;

(d) collecting the reference light reflected from the reference surface and directing the collected reference light along a second optical axis;

(e) focusing the collected light directed along said first and second optical axes to form a fringed image pattern resulting from interference of object light and reference light;

(f) scanning the fringed image patterns along all edges formed by the attribute and in a direction perpendicular to those edges;

(g) incrementally changing the position of the wafer along the first optical axis, each time repeating steps (a) through (f);

(h) inspecting the image patterns to develop phase coherence data along each of the scanned edges;

(i) processing the phase coherence data to develop synthetic image data corresponding to a cross-sectional profile of the edges on the attributes taken in a plane including the selected scanned edges;

(j) determining the attribute edges or center by applying edge detection algorithms or center of mass algorithms to the synthetic image data; and (k) using the attribute edges or center to compute an alignment value that represents the amount of misregistration between the layers of the semiconductor wafer.

12. A process as recited in claim 11 wherein the step of using the attribute edges or center includes the steps of:

computing the center of a first attribute from a first layer as defined by the edges thereof;

computing the center of a corresponding second attribute from a second layer as defined by the edges thereof;

computing the difference between the center of the first attribute and the center of the second attribute, which represents an amount of misregistration between the first layer and the second layer; and reporting the amount of misregistration to a suitable display means.

* * * * *